United States Patent
Srinivasan et al.

(10) Patent No.: US 8,557,697 B2
(45) Date of Patent: *Oct. 15, 2013

(54) VAPOR DEPOSITION METHODS FOR FORMING A METAL-CONTAINING LAYER ON A SUBSTRATE

(75) Inventors: Bhaskar Srinivasan, Boise, ID (US); John Smythe, Boise, ID (US)

(73) Assignee: Micron Technology, Inc., Boise, ID (US)

(*) Notice: Subject to any disclaimer, the term of this patent is extended or adjusted under 35 U.S.C. 154(b) by 337 days.

This patent is subject to a terminal disclaimer.

(21) Appl. No.: 12/893,807

(22) Filed: Sep. 29, 2010

(65) Prior Publication Data

US 2011/0021001 A1    Jan. 27, 2011

Related U.S. Application Data

(63) Continuation of application No. 11/705,992, filed on Feb. 14, 2007, now Pat. No. 7,892,964.

(51) Int. Cl.
*H01L 21/4763* (2006.01)

(52) U.S. Cl.
USPC ........... 438/635; 438/584; 438/591; 438/656; 438/680; 427/255.7; 257/E21.09

(58) Field of Classification Search
None
See application file for complete search history.

(56) References Cited

U.S. PATENT DOCUMENTS

| | | |
|---|---|---|
| 5,256,244 A | 10/1993 | Ackerman |
| 5,609,927 A | 3/1997 | Summerfelt et al. |
| 5,686,151 A | 11/1997 | Imai et al. |
| 5,688,724 A | 11/1997 | Yoon et al. |
| 5,830,270 A | 11/1998 | McKee et al. |
| 6,444,478 B1 | 9/2002 | Basceri et al. |
| 6,525,365 B1 | 2/2003 | Basceri et al. |
| 6,566,147 B2 | 5/2003 | Basceri et al. |
| 6,586,348 B2 | 7/2003 | Hartner et al. |
| 6,602,344 B2 | 8/2003 | Natori et al. |
| 6,664,584 B2 | 12/2003 | Yang et al. |
| 6,730,164 B2 | 5/2004 | Vaartstra et al. |
| 6,785,120 B1 | 8/2004 | Basceri et al. |
| 6,838,293 B2 | 1/2005 | Basceri et al. |
| 6,911,402 B2 | 6/2005 | Lee et al. |
| 6,962,824 B2 | 11/2005 | Basceri et al. |
| 7,008,669 B2 | 3/2006 | Natori et al. |

(Continued)

FOREIGN PATENT DOCUMENTS

| | | |
|---|---|---|
| TW | 097104733 | 2/2013 |
| WO | WO 00/15865 | 3/2000 |

(Continued)

OTHER PUBLICATIONS

Sakuma et al. ("Barrier layer realization of high capacitance density in SrTiO3 thin film capacitor on silicon", Applied Physics Letters, 57(23), pp. 2431-2433, 1990).*

(Continued)

*Primary Examiner* — Yasser Abdelaziez
(74) *Attorney, Agent, or Firm* — Wells St. John, P.S.

(57) ABSTRACT

Atomic layer deposition methods as described herein can be advantageously used to form a metal-containing layer on a substrate. For example, certain methods as described herein can form a strontium titanate layer that has low carbon content (e.g., low strontium carbonate content), which can result in layer with a high dielectric constant.

24 Claims, 6 Drawing Sheets

(56) References Cited

U.S. PATENT DOCUMENTS

| | | | |
|---|---|---|---|
| 7,108,747 | B1 | 9/2006 | Leskela et al. |
| 7,115,166 | B2 | 10/2006 | Vaartstra et al. |
| 7,638,074 | B2 | 12/2009 | Xu et al. |
| 8,206,784 | B2 | 6/2012 | Xu et al. |
| 2003/0113480 | A1 | 6/2003 | Kil et al. |
| 2004/0040494 | A1 | 3/2004 | Vaartstra et al. |
| 2004/0224467 | A1 | 11/2004 | Basceri et al. |
| 2006/0219157 | A1 | 10/2006 | Rahtu et al. |
| 2006/0292841 | A1 | 12/2006 | Quick |
| 2008/0072819 | A1 | 3/2008 | Rahtu et al. |
| 2009/0074965 | A1 | 3/2009 | Xu et al. |
| 2010/0062150 | A1 | 3/2010 | Xu et al. |

FOREIGN PATENT DOCUMENTS

| | | |
|---|---|---|
| WO | WO 2007/106788 | 9/2007 |
| WO | PCT/2008/052035 | 12/2008 |
| WO | PCT/US2008/052035 | 12/2008 |
| WO | PCT/US2008/052305 | 12/2008 |

OTHER PUBLICATIONS

Balachandran et al., "On the Defect Structure of Strontium Titanate with Excess SrO", J. Materials Sci, 17(2), pp. 2133-2140, Jul. 1982.

Balachandran et al., "Raman Spectra of Strontium Titanate", Journal of American Ceramic Society, 65(4), C-54 to C-56, Apr. 1982.

Eror et al., "High-Temperature Defect Structure fo Acceptor-Doped Strontium Titanate", Journal of American Ceramic Society, 65(9), pp. 426-431, Sep. 1982.

Gomann et al., "Sr Diffusion in Undoped and La-Doped SrTiO, Single Crystals Under Oxidizing Conditions", Phys. Chem. Chem. Phys., 7:7(09), pp. 2053-2060, May 7, 2005.

Hawley, "The Condensed Chemical Dictionary", 10th Edition, Von Nostrand Reinhold Co., New York, title page, copyright page, and pp. 225-226, 1981.

Kosola et al., "Effect of annealing in processing of strontium titanate thin films by ALD", Applied Surface Science, 211, pp. 102-112, 2003.

Raevski et al, "Study of Intrinsic Point Defects in Oxides of the Perovskite Family: II. Experiment", J. Phys.: Condens. Matter, 10(36), pp. 8015-8032, Sep. 14, 1998.

Vehkamaki et al., "Growth of SrTiO3 and BaTiO3 Thin Films by Atomic Layer Deposition", Electrochemical and Solid-State Letters, 2(10), pp. 504-506, Oct. 1999.

Written Opinion in Singapore Patent Application No. 200904671-5, including pending claims; Sep. 21, 2011; 12 pp.

* cited by examiner

VAPOR DEPOSITION METHODS FOR FORMING A METAL-CONTAINING LAYER ON A SUBSTRATE

RELATED PATENT DATA

This patent resulted from a continuation application of U.S. patent application Ser. No. 11/705,992, filed Feb. 14, 2007, entitled "Vapor Deposition Methods for Forming A Metal-Containing Layer on a Substrate", naming Bhaskar Srinivasan and John Smythe as inventors, the disclosure of which is incorporated by reference.

BACKGROUND

The scaling down of integrated circuit devices has created a need to incorporate high dielectric constant (i.e., high dielectric permittivity) materials into capacitors and gates. The search for new high dielectric constant materials and processes is becoming more important as the minimum size for current technology is practically constrained by the use of standard dielectric materials. Dielectric materials containing alkaline earth metals can provide a significant advantage in capacitance compared to conventional dielectric materials. For example, a perovskite material, strontium titanate (SrTiO$_3$), has a disclosed bulk dielectric constant of up to 500.

Unfortunately, the successful integration of alkaline earth metals into vapor deposition processes has proven to be difficult. For example, although atomic layer deposition (ALD) of strontium β-diketonates has been disclosed, the poor reactivity of these precursor compounds often requires high substrate temperatures and strong oxidizers to grow a film, which is often contaminated with carbon-containing impurities. Carbon-containing impurities such as strontium carbonate, for example, are undesirable because the impurities can substantially lower the dielectric constant of the resulting film. Efforts to remove such carbon-containing impurities from high dielectric constant films have met with limited success due at least in part to the inconvenient and/or expensive technologies that have been employed, including, for example, exposure to ultraviolet (UV) radiation in ozone, and high pressure isotropic reactive ion etching.

New methods of preparing high dielectric constant films are being sought for current and new generations of integrated circuit devices.

BRIEF DESCRIPTION OF THE DRAWING

FIG. 5 is a plot illustrating x-ray diffraction data (XRD) for (5a) an embodiment of a metal-containing layer prepared by a method as described in Comparative Example 1; and (5b) an embodiment of a metal-containing layer prepared by a method as described in Example 1.

FIG. 6 is a plot illustrating angle resolved x-ray photoelectron spectra for an oxygen multiplex graph (6a) and a carbon multiplex graph (6b) for an embodiment of a metal-containing layer prepared by a method as described in Comparative Example 1 (scan 1); and an embodiment of a metal-containing layer prepared by a method as described in Example 1 (scan 2).

The following description of various embodiments of the methods as described herein is not intended to describe each embodiment or every implementation of such methods. Rather, a more complete understanding of the methods as described herein will become apparent and appreciated by reference to the following description and claims in view of the accompanying drawing. Further, it is to be understood that other embodiments may be utilized and structural changes may be made without departing from the scope of the present disclosure.

DETAILED DESCRIPTION OF ILLUSTRATIVE EMBODIMENTS

The formation of strontium titanate films having a substantially 1:1 atomic ratio of strontium:titanium are desired for producing defect free SrTiO$_3$ films that crystallize into the cubic phase upon annealing. The presence of the crystalline cubic phase can result in the high dielectric constants for which perovskite materials are known. Further, there is a desire to reduce and/or eliminate carbon-containing impurities, such as strontium carbonate (SrCO$_3$), in strontium titanate films, because such carbon-containing impurities can be detrimental to the electrical properties of the film. Certain embodiments of the atomic layer deposition methods described herein can provide at least some of the desired properties.

Figure 1:
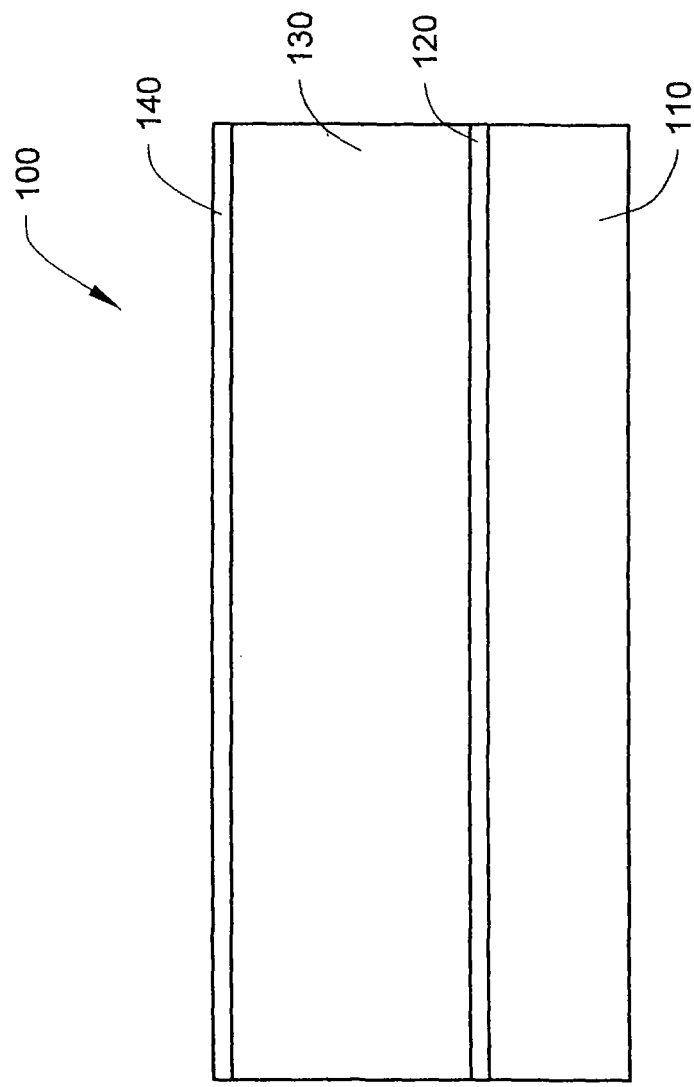
FIG. 1 is a schematic side view of illustrating an embodiment of a metal-containing layer deposited on a substrate by atomic layer deposition methods as described in the present disclosure.

FIG. 1 is an illustration of a construction 100 that can be prepared by methods as disclosed herein. Referring to FIG. 1, an initial titanium oxide deposition phase can deposit a layer of titanium oxide 120 on substrate 110. In certain embodiments, titanium oxide layer 120 can be less than 1 nanometer thick, and in other certain embodiments, at most 0.6 nanometer thick. In certain embodiments, titanium oxide layer 120 can be at least 0.3 nanometer thick. The initial titanium oxide deposition phase includes a plurality of titanium oxide deposition cycles. As used herein, "plurality" means two or more. In some embodiments, the initial titanium oxide deposition phase consists of, or consists essentially of, a plurality of titanium oxide deposition cycles. For example, in certain embodiments, the initial titanium oxide deposition phase can consist of from 11 to 14 titanium oxide deposition cycles.

Again referring to FIG. 1, an intermediate deposition phase can deposit a layer of strontium oxide/titanium oxide 130 on titanium oxide layer 120. The thickness of the strontium oxide/titanium oxide layer 130 can be controlled as desired for a given application based on the number of deposition cycles employed. In certain embodiments, strontium oxide/titanium oxide layer 130 can be at least 1 nanometer thick, and in other embodiments at least 2 nanometers thick. Although in general the maximum thickness of the strontium oxide/titanium oxide layer is limited only by the requirements of the specific application (e.g., 50 nanometers, 100 nanometers, or even thicker), in certain illustrative embodiments as described herein, the maximum thickness of the strontium oxide/titanium oxide layer 130 can be, for example, 20 nanometers, 30 nanometers, or 40 nanometers.

The intermediate deposition phase includes a plurality of strontium oxide deposition cycles and a plurality of titanium oxide deposition cycles. In some embodiments, the intermediate deposition phase can include alternating strontium oxide and titanium oxide deposition cycles. In other embodiments, the intermediate deposition phase can include a plurality of consecutive strontium oxide deposition cycles alternating with a titanium oxide deposition cycle. In still other embodiments, the intermediate deposition phase can include a strontium oxide deposition cycle alternating with a plurality of consecutive titanium oxide deposition cycles. In yet other embodiments, the intermediate deposition phase can include a plurality of consecutive strontium oxide deposition cycles alternating with a plurality of consecutive titanium oxide deposition cycles. In still other embodiments, the intermediate deposition phase can include, consist of, or consist essentially of, a combination of the above-described sequences of deposition cycles.

The number and sequence of strontium oxide and titanium oxide deposition cycles in the intermediate deposition phase can be varied by one of skill in the art to result, for example, in a strontium titanate layer of the desired thickness and having a substantially 1:1 atomic ratio of strontium:titanium. For example, in certain embodiments, the intermediate deposition phase can include multiple sets (e.g., from 4 to 20 or even more sets) of from 2 to 4 consecutive strontium oxide deposition cycles alternating with from 7 to 14 consecutive titanium oxide deposition cycles. In certain embodiments, the intermediate deposition phase begins with and ends with one or more strontium oxide deposition cycles. As used herein, the term "or" is generally employed in the sense as including "and/or" unless the context of the usage clearly indicates otherwise.

Once again referring to FIG. 1, a final titanium oxide deposition phase can deposit a layer of titanium oxide 140 on intermediate deposition layer 130. In certain embodiments, titanium oxide layer 140 can be at most 1 nanometer thick, and in other certain embodiments, at most 0.6 nanometer thick. In certain embodiments, titanium oxide layer 140 can be at least 0.3 nanometer thick. The final titanium oxide deposition phase includes a plurality of titanium oxide deposition cycles. In some embodiments, the final titanium oxide deposition phase consists of, or consists essentially of, a plurality of titanium oxide deposition cycles. For example, in certain embodiments, the final titanium oxide deposition phase can consist of from 11 to 14 titanium oxide deposition cycles.

Advantageously, it has been found that at least some of the methods described herein can provide strontium titanate films characterized, for example, by substantially a 1:1 strontium:titanium atomic ratio and/or a low carbon-containing impurity (e.g., $SrCO_3$) content, properties that can result, for example, in high dielectric constants. Strontium:titanium atomic ratios of from 0.9:1.0 to 1.0:0.9 are considered herein to be substantially 1:1 strontium:titanium atomic ratios. As used herein, the recitations of numerical ranges by endpoints include all numbers subsumed within that range (e.g., 1 to 5 includes 1, 1.5, 2, 2.75, 3, 3.80, 4, 5, etc.).

Strontium carbonate contents of less than or equal to 5 atomic percent (based on metal atoms) as deposited, and particularly after annealing, are desirable for low carbon-content strontium titanates. Strontium titanates having low carbon-content, and in certain embodiments no detectable carbon-content, can be advantageous for producing strontium titanate films having the desired crystalline perovskite (e.g., cubic) phase, as deposited and/or after annealing. Strontium titanate films with the desired crystalline perovskite phase can be advantageous for having high dielectric constants.

Metal-containing precursor compositions can be used to form metal-containing layers in various methods as described in the present disclosure. As used herein, "metal-containing" is used to refer to a material, typically a compound or a layer, that may consist entirely of a metal, or may include other elements in addition to a metal. Typical metal-containing compounds include, but are not limited to, metals, metal-ligand complexes, metal salts, organometallic compounds, and combinations thereof. Typical metal-containing layers include, but are not limited to, metals, metal oxides, metal silicates, and combinations thereof.

Various metal-containing compounds can be used in various combinations, optionally with one or more organic solvents (particularly for CVD processes), to form a precursor composition. Some of the metal-containing compounds disclosed herein can be used in ALD without adding solvents. "Precursor" and "precursor composition" as used herein, refer to a composition usable for forming, either alone or with other precursor compositions (or reactants), a layer on a substrate assembly in a deposition process. Further, one skilled in the art will recognize that the type and amount of precursor used will depend on the content of a layer which is ultimately to be formed using a vapor deposition process. In certain embodiments of the methods as described herein, the precursor compositions are liquid at the vaporization temperature, and sometimes liquid at room temperature.

The precursor compositions may be liquids or solids at room temperature, and for certain embodiments are liquids at the vaporization temperature. Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they can be sufficiently soluble in an organic solvent or have melting points below their decomposition temperatures such that they can be used, for example, in flash vaporization, bubbling, microdroplet formation techniques, etc.

Herein, vaporized metal-containing compounds may be used either alone or optionally with vaporized molecules of other metal-containing compounds or optionally with vaporized solvent molecules or inert gas molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as an inert carrier gas.

"Inert gas" or "non-reactive gas," as used herein, is any gas that is generally unreactive with the components it comes in contact with. For example, inert gases are typically selected from a group including nitrogen, argon, helium, neon, krypton, xenon, any other non-reactive gas, and mixtures thereof. Such inert gases are generally used in one or more purging processes as described herein, and in some embodiments may also be used to assist in precursor vapor transport.

Solvents that are suitable for certain embodiments of methods as described herein may be one or more of the following: aliphatic hydrocarbons or unsaturated hydrocarbons (C3-C20, and in certain embodiments C5-C10, cyclic, branched, or linear), aromatic hydrocarbons (C5-C20, and in certain embodiments C5-C10), halogenated hydrocarbons, silylated hydrocarbons such as alkylsilanes, alkylsilicates, ethers, cyclic ethers (e.g., tetrahydrofuran, THF), polyethers, thioethers, esters, lactones, nitriles, silicone oils, or compounds containing combinations of any of the above or mixtures of one or more of the above. The compounds are also generally compatible with each other, so that mixtures of variable quantities of the metal-containing compounds will not interact to significantly change their physical properties.

Methods as described herein use metal precursor compounds. As used herein, a "metal precursor compound" is used to refer to a compound that can provide a source of the metal in an atomic layer deposition method. Further, in some embodiments, the methods include "metal-organic" precursor compounds. The term "metal-organic" is intended to be broadly interpreted as referring to a compound that includes in addition to a metal, an organic group (i.e., a carbon-containing group). Thus, the term "metal-organic" includes, but is not limited to, organometallic compounds, metal-ligand complexes, metal salts, and combinations thereof.

A wide variety of metal-organic strontium precursor compounds can be used for methods as described herein. Example metal-organic strontium precursor compounds include, but are not limited to, strontium β-diketonates, strontium β-diketiminates (e.g., bis(N,N'-diisopropyl-2,4-pentanediiminate)strontium), strontium amidinates (e.g., bis(N-dimethyl-N',N''-diisopropylguanidinate)strontium), strontium cyclopentadienyls (e.g., bis(triisopropylcyclopentadienyl)strontium), strontium diorganoamides (e.g., Sr[N(SiMe$_3$)$_2$]$_2$), strontium carboxylates, strontium alkoxides, and combinations thereof.

Strontium β-diketonates are defined herein as a strontium-containing compound including at least one β-diketonate ligand. As used herein, "a," "an," "the," and "at least one" are used interchangeably and mean one or more than one. Example β-diketonate ligands include, for example, 2,2,6,6-tetramethyl-3,5-heptanedionate (thd), 1-(2-methoxyethoxy)-2,2,6,6-tetramethyl-3,5-heptanedionate (methd), hexafluoroacetylacetonate, 1,1,1-trifluoro-2,4-pentanedionate, 2,2-dimethyl-6,6,7,7,8,8,8-heptafluoro-3,5-octanedionate (fod), and combinations thereof. Example metal-organic strontium β-diketonate precursor compounds include Sr(thd)$_2$, Sr(methd)$_2$, Sr(fod)$_2$, and combinations thereof.

A wide variety of titanium precursor compounds can be used in methods as described herein. In certain embodiments, the titanium precursor compound can be an inorganic precursor compound (e.g., titanium tetrachloride, TiCl$_4$). In other certain embodiments, the titanium precursor compound can be a metal-organic precursor compound. For example, metal-organic titanium precursor compounds can be of the formula Ti(AR$^1_x$)$_4$, wherein: A is O, N, C(O), or OC(O); and R$^1$ is a (C1-C10)alkyl group; wherein two of the R$^1$ alkyl groups are optionally joined together to form an alkylene group; and x=1 or 2.

Example metal-organic titanium precursor compounds include, but are not limited to, titanium alkoxides, titanium amides, titanium imides, titanium β-diketonates, and combinations thereof. Example metal-organic titanium precursor compounds include, but are not limited to, tetrakis(isopropoxy) titanium (Ti(OiPr)$_4$); tetrakis(diethylamido) titanium (Ti(NEt$_2$)$_4$); tetrakis(dimethylamido) titanium (Ti(NMe$_2$)$_4$; tetrakis(ethylmethylamido) titanium (Ti(NEtMe)$_4$); trichlorotitanium dialkylamides; and combinations thereof.

Example metal-organic titanium precursor compounds also include, but are not limited to, titanium β-diketonates, which are defined herein as a titanium-containing compound including at least one β-diketonate ligand. Example β-diketonateligands include, but are not limited to, 2,2,6,6-tetramethyl-3,5-heptanedionate (thd), 1-(2-methoxyethoxy)-2,2,6,6-tetramethyl-3,5-heptanedionate (methd), hexafluoroacetylacetonate, 1,1,1-trifluoro-2,4-pentanedionate, 2,2-dimethyl-6,6,7,7,8,8,8-heptafluoro-3,5-octanedionate (fod), and combinations thereof. Example titanium β-diketonate precursor compounds include, but are not limited to, Ti(thd)$_2$(OiPr)$_2$, Ti(mpd)(thd)$_2$, and combinations thereof, wherein mpd=2-methyl-2,4-pentanedioxy; thd=2,2,6,6-tetramethyl-3,5-heptanedionate; and OiP=isopropoxide.

Another example metal-organic titanium precursor compound includes Ti(2meip)2, wherein 2meip=4-(2-methylethoxy)imino-2-pentanoate.

As used herein, the term "organic group" is used for the purpose of this disclosure to mean a hydrocarbon group that is classified as an aliphatic group, cyclic group, or combination of aliphatic and cyclic groups (e.g., alkaryl and aralkyl groups). In the context of the present disclosure, suitable organic groups for metal-containing compounds of this disclosure are those that do not interfere with the formation of a metal oxide layer using vapor deposition techniques. In the context of the present disclosure, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, tert-butyl, amyl, heptyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, S, Si, or F atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, tert-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, tert-butyl, and the like.

Precursor compositions as described herein can, optionally, be vaporized and deposited/chemisorbed substantially simultaneously with, and in the presence of, one or more reaction gases. Alternatively, the metal-containing layers may be formed by alternately introducing the precursor composition and the reaction gas(es) during each deposition cycle. Such reaction gases can include, for example, nitrogen-containing sources (e.g., ammonia) and oxygen-containing sources, which can be oxidizing gases. A wide variety of suitable oxidizing gases can be used including, for example, air, oxygen, water vapor, ozone, nitrogen oxides (e.g., nitric oxide), hydrogen peroxide, alcohols (e.g., isopropanol), and combinations thereof.

The metal-containing layer can be deposited, for example, on a substrate (e.g., a semiconductor substrate or substrate assembly). "Semiconductor substrate" or "substrate assembly" as used herein refer to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as transistors, active areas, diffusions, implanted regions, vias, contact openings, high aspect ratio openings, capacitor plates, barriers for capacitors, etc.

"Layer," as used herein, refers to any layer that can be formed on a substrate from one or more precursors and/or reactants according to the deposition process described herein. The term "layer" is meant to include layers specific to the semiconductor industry, such as, but clearly not limited to, a barrier layer, dielectric layer (i.e., a layer having a high dielectric constant), and conductive layer. The term "layer" is synonymous with the term "film" frequently used in the semiconductor industry. The term "layer" is also meant to include layers found in technology outside of semiconductor technology, such as coatings on glass. For example, such layers can be formed directly on fibers, wires, etc., which are substrates other than semiconductor substrates. Further, the layers can be formed directly on the lowest semiconductor surface of the substrate, or they can be formed on any of a variety of layers (e.g., surfaces) as in, for example, a patterned wafer.

Suitable substrate materials of the present disclosure include conductive materials, semiconductive materials, conductive metal-nitrides, conductive metals, conductive metal oxides, etc. The substrate on which the metal-containing layer is formed can be a semiconductor substrate or substrate assembly. A wide variety of semiconductor materials are contemplated, such as for example, borophosphosilicate glass (BPSG), silicon such as, e.g., conductively doped polysilicon, monocrystalline silicon, etc. (for this disclosure, appropriate forms of silicon are simply referred to as "silicon"), for example in the form of a silicon wafer, tetraethylorthosilicate (TEOS) oxide, spin on glass (i.e., a thin layer of $SiO_2$, optionally doped, deposited by a spin on process), TiN, TaN, W, Ru, Al, Cu, noble metals, etc. A substrate assembly may also contain a layer that includes platinum, iridium, iridium oxide, rhodium, ruthenium, ruthenium oxide, strontium ruthenate, lanthanum nickelate, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices, static random access memory (SRAM) devices, and ferroelectric memory (FERAM) devices, for example.

For substrates including semiconductor substrates or substrate assemblies, the layers can be formed directly on the lowest semiconductor surface of the substrate, or they can be formed on any of a variety of the layers (i.e., surfaces) as in a patterned wafer, for example.

Substrates other than semiconductor substrates or substrate assemblies can also be used in presently disclosed methods. Any substrate that may advantageously form a metal-containing layer thereon, such as a metal oxide layer, may be used, such substrates including, for example, fibers, wires, etc.

The precursor compositions can be vaporized in the presence of an inert carrier gas if desired. Additionally, an inert carrier gas can be used in purging steps in an ALD process (discussed below). The inert carrier gas is typically one or more of nitrogen, helium, argon, etc. In the context of the present disclosure, an inert carrier gas is one that does not interfere with the formation of the metal-containing layer. Whether done in the presence of a inert carrier gas or not, the vaporization can be done in the absence of oxygen to avoid oxygen contamination of the layer (e.g., oxidation of silicon to form silicon dioxide or oxidation of precursor in the vapor phase prior to entry into the deposition chamber).

The terms "deposition process" and "vapor deposition process" as used herein refer to a process in which a metal-containing layer is formed on one or more surfaces of a substrate (e.g., a doped polysilicon wafer) from vaporized precursor composition(s) including one or more metal-containing compound(s). Specifically, one or more metal-containing compounds are vaporized and directed to and/or contacted with one or more surfaces of a substrate (e.g., semiconductor substrate or substrate assembly) placed in a deposition chamber. Typically, the substrate is heated. These metal-containing compounds can form (e.g., by reacting or decomposing) a non-volatile, thin, uniform, metal-containing layer on the surface(s) of the substrate. For the purposes of this disclosure, the term "vapor deposition process" is meant to include both chemical vapor deposition processes (including pulsed chemical vapor deposition processes) and atomic layer deposition processes.

The term "atomic layer deposition" (ALD) as used herein refers to a vapor deposition process in which deposition cycles, for example a plurality of consecutive deposition cycles, are conducted in a process chamber (i.e., a deposition chamber). Typically, during each cycle a precursor is chemisorbed to a deposition surface (e.g., a substrate assembly surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition," "atomic layer epitaxy" (ALE) (see U.S. Pat. No. 5,256,244 to Ackerman), molecular beam epitaxy (MBE), gas source MBE, or organometallic MBE, and chemical beam epitaxy when performed with alternating pulses of precursor composition(s), reactive gas, and purge (e.g., inert carrier) gas.

As compared to the one cycle chemical vapor deposition (CVD) process, the longer duration multi-cycle ALD process allows for improved control of layer thickness and composition by self-limiting layer growth, and minimizing detrimental gas phase reactions by separation of the reaction components. The self-limiting nature of ALD provides a method of depositing a film on a wide variety of reactive surfaces, including surfaces with irregular topographies, with better step coverage than is available with CVD or other "line of sight" deposition methods such as evaporation or physical vapor deposition (PVD or sputtering).

In certain embodiments, atomic layer deposition methods as disclosed herein include a plurality of deposition phases such as, for example, an initial titanium oxide deposition phase, an intermediate deposition phase, and a final titanium oxide deposition phase. Each deposition phase includes a plurality of deposition cycles.

For example, a titanium oxide deposition phase (e.g., an initial titanium oxide deposition phase and/or a final titanium oxide deposition phase) includes a plurality of titanium oxide deposition cycles. Typically, each titanium oxide deposition cycle can include, for example, at least one titanium precursor dose, a first purge, at least one oxidizer dose, and a second purge.

For another example, an intermediate deposition phase includes a plurality of strontium oxide deposition cycles and a plurality of titanium oxide deposition cycles (as described herein above). Typically, each strontium oxide deposition cycle can include, for example, at least one strontium precursor dose, a first purge, at least one oxidizer dose, and a second purge.

Chemical vapor deposition (CVD) and atomic layer deposition (ALD) are two vapor deposition processes often employed to form thin, continuous, uniform, metal-containing layers onto semiconductor substrates. Using either vapor deposition process, typically one or more precursor compositions are vaporized in a deposition chamber and optionally combined with one or more reaction gases and directed to and/or contacted with the substrate to form a metal-containing layer on the substrate. It will be readily apparent to one skilled in the art that the vapor deposition process may be enhanced by employing various related techniques such as plasma assistance, photo assistance, laser assistance, as well as other techniques.

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

The vapor deposition process employed in the methods of the present disclosure can be a multi-cycle atomic layer deposition (ALD) process. Such a process is advantageous, in particular advantageous over a CVD process, in that it provides for improved control of atomic-level thickness and uniformity to the deposited layer (e.g., dielectric layer) by providing a plurality of self-limiting deposition cycles. The self-limiting nature of ALD provides a method of depositing a film on a wide variety of reactive surfaces including, for example, surfaces with irregular topographies, with better step coverage than is available with CVD or other "line of sight" deposition methods (e.g., evaporation and physical vapor deposition, i.e., PVD or sputtering). Further, ALD processes typically expose the metal-containing compounds to lower volatilization and reaction temperatures, which tends to decrease degradation of the precursor as compared to, for example, typical CVD processes.

Generally, in an ALD process each reactant is pulsed onto a suitable substrate, typically at deposition temperatures of at least 25° C., in certain embodiments at least 150° C., and in other embodiments at least 200° C. Typical ALD deposition temperatures are no greater than 400° C., in certain embodiments no greater than 350° C., and in other embodiments no greater than 250° C. These temperatures are generally lower than those presently used in CVD processes, which typically include deposition temperatures at the substrate surface of at least 150° C., in some embodiments at least 200° C., and in other embodiments at least 250° C. Typical CVD deposition temperatures are no greater than 600° C., in certain embodiments no greater than 500° C., and in other embodiments no greater than 400° C.

Under such conditions the film growth by ALD is typically self-limiting (i.e., when the reactive sites on a surface are used up in an ALD process, the deposition generally stops), insuring not only excellent conformality but also good large area uniformity plus simple and accurate composition and thickness control. Due to alternate dosing of the precursor compositions and/or reaction gases, detrimental vapor-phase reactions are inherently eliminated, in contrast to the CVD process that is carried out by continuous co-reaction of the precursors and/or reaction gases. (See Vehkamäki et al, "Growth of $SrTiO_3$ and $BaTiO_3$ Thin Films by Atomic Layer Deposition," Electrochemical and Solid-State Letters, 2(10): 504-506 (1999)).

A typical ALD process includes exposing a substrate (which may optionally be pretreated with, for example, water and/or ozone) to a first chemical to accomplish chemisorption of the species onto the substrate. The term "chemisorption" as used herein refers to the chemical adsorption of vaporized reactive metal-containing compounds on the surface of a substrate. The adsorbed species are typically irreversibly bound to the substrate surface as a result of relatively strong binding forces characterized by high adsorption energies (e.g., >30 kcal/mol), comparable in strength to ordinary chemical bonds. The chemisorbed species typically form a monolayer on the substrate surface. (See "The Condensed Chemical Dictionary," 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate precursor compositions or reaction gases are alternately introduced (e.g., pulsed) into a deposition chamber and chemisorbed onto the surfaces of a substrate. Each sequential introduction of a reactive compound (e.g., one or more precursor compositions and one or more reaction gases) is typically separated by an inert carrier gas purge. Each precursor composition co-reaction adds a new atomic layer to previously deposited layers to form a cumulative solid layer. The cycle is repeated to gradually form the desired layer thickness. It should be understood that ALD can alternately utilize one precursor composition, which is chemisorbed, and one reaction gas, which reacts with the chemisorbed species.

Practically, chemisorption might not occur on all portions of the deposition surface (e.g., previously deposited ALD material). Nevertheless, such imperfect monolayer is still considered a monolayer in the context of the present disclosure. In many applications, merely a substantially saturated monolayer may be suitable. In one aspect, a substantially saturated monolayer is one that will still yield a deposited monolayer or less of material exhibiting the desired quality and/or properties. In another aspect, a substantially saturated monolayer is one that is self-limited to further reaction with precursor.

A typical ALD process includes exposing an initial substrate to a first chemical species A (e.g., a metal-containing compound as described herein) to accomplish chemisorption of the species onto the substrate. Species A can react either with the substrate surface or with Species B (described below), but not with itself. Typically in chemisorption, one or more of the ligands of Species A is displaced by reactive groups on the substrate surface. Theoretically, the chemisorption forms a monolayer that is uniformly one atom or molecule thick on the entire exposed initial substrate, the monolayer being composed of Species A, less any displaced ligands. In other words, a saturated monolayer is substantially formed on the substrate surface. Practically, chemisorption may not occur on all portions of the substrate. Nevertheless, such a partial monolayer is still understood to be a monolayer in the context of the present disclosure. In many applications, merely a substantially saturated monolayer may be suitable. A substantially saturated monolayer is one that will still yield a deposited layer exhibiting the quality and/or properties desired for such layer.

The first species (e.g., substantially all non-chemisorbed molecules of Species A) as well as displaced ligands are purged from over the substrate and a second chemical species, Species B (e.g., a different metal-containing compound or reactant gas) is provided to react with the monolayer of Species A. Species B typically displaces the remaining ligands from the Species A monolayer and thereby is chemisorbed and forms a second monolayer. This second monolayer displays a surface which is reactive only to Species A. Non-chemisorbed Species B, as well as displaced ligands and other byproducts of the reaction are then purged and the steps are repeated with exposure of the Species B monolayer to vaporized Species A. Optionally, the second species can react with the first species, but not chemisorb additional material thereto. That is, the second species can cleave some portion of the chemisorbed first species, altering such monolayer without forming another monolayer thereon, but leaving reactive sites available for formation of subsequent monolayers. In other ALD processes, a third species or more may be successively chemisorbed (or reacted) and purged just as described for the first and second species, with the understanding that each introduced species reacts with the monolayer produced immediately prior to its introduction. Optionally, the second species (or third or subsequent) can include at least one reaction gas if desired.

Thus, the use of ALD provides the ability to improve the control of thickness, composition, and uniformity of metal-containing layers on a substrate. For example, depositing thin layers of metal-containing compound in a plurality of cycles provides a more accurate control of ultimate film thickness. This is particularly advantageous when the precursor composition is directed to the substrate and allowed to chemisorb thereon, optionally further including at least one reaction gas that can react with the chemisorbed species on the substrate, and in certain embodiments wherein this cycle is repeated at least once.

Purging of excess vapor of each species following deposition/chemisorption onto a substrate may involve a variety of techniques including, but not limited to, contacting the substrate and/or monolayer with an inert carrier gas and/or lowering pressure to below the deposition pressure to reduce the concentration of a species contacting the substrate and/or chemisorbed species. Examples of carrier gases, as discussed above, may include $N_2$, Ar, He, etc. Additionally, purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only react with the surface created from the chemisorption of the first species and thus, may also be self-limiting. Once all of the finite number of sites on a substrate are bonded with a first species, the first species will not bond to other of the first species already bonded with the substrate. However, process conditions can be varied in ALD to promote such bonding and render ALD not self-limiting, e.g., more like pulsed CVD. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge of one of ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal-containing layer (usually less than one monolayer such that the growth rate on average is 0.02 to 0.3 nanometers per cycle), until a layer of the desired thickness is built up on the substrate of interest. The layer deposition is accomplished by alternately introducing (i.e., by pulsing) precursor composition(s) into the deposition chamber containing a substrate, chemisorbing the precursor composition(s) as a monolayer onto the substrate surfaces, purging the deposition chamber, then introducing to the chemisorbed precursor composition(s) reaction gases and/or other precursor composition(s) in a plurality of deposition cycles until the desired thickness of the metal-containing layer is achieved.

The pulse duration of precursor composition(s) and inert carrier gas(es) is generally of a duration sufficient to saturate the substrate surface. Typically, the pulse duration is at least 0.1 seconds, in certain embodiments at least 0.2 second, and in other embodiments at least 0.5 second. Typically pulse durations are generally no greater than 2 minutes, and in certain embodiments no greater than 1 minute.

In comparison to the predominantly thermally driven CVD, ALD is predominantly chemically driven. Thus, ALD may advantageously be conducted at much lower temperatures than CVD. During the ALD process, the substrate temperature may be maintained at a temperature sufficiently low to maintain intact bonds between the chemisorbed precursor composition(s) and the underlying substrate surface and to prevent decomposition of the precursor composition(s). The temperature, on the other hand, must be sufficiently high to avoid condensation of the precursor composition(s). Typically the substrate is kept at a temperature of at least 25° C., in certain embodiments at least 150° C., and in other certain embodiments at least 200° C. Typically the substrate is kept at a temperature of no greater than 400° C., in certain embodiments no greater than 350° C., and in other certain embodiments no greater than 300° C., which, as discussed above, is generally lower than temperatures presently used in typical CVD processes. Thus, the first species or precursor composition is chemisorbed at this temperature. Surface reaction of the second species or precursor composition can occur at substantially the same temperature as chemisorptiOn of the first precursor or, optionally, at a substantially different temperature. Clearly, some small variation in temperature, as judged by those of ordinary skill, can occur but still be considered substantially the same temperature by providing a reaction rate statistically the same as would occur at the temperature of the first precursor chemisorption. Alternatively, chemisorption and subsequent reactions could instead occur at substantially exactly the same temperature.

For a typical vapor deposition process, the pressure inside the deposition chamber can be at least $10^{-8}$ torr ($1.3 \times 10^{-6}$ Pascal, "Pa"), in certain embodiments at least $10^{-7}$ torr ($1.3 \times 10^{-5}$ Pa), and in other certain embodiments at least $10^{-6}$ ton ($1.3 \times 10^{-4}$ Pa). Further, deposition pressures are typically no greater than 10 ton ($1.3 \times 10^3$ Pa), in certain embodiments no greater than 5 ton ($6.7 \times 10^2$ Pa), and in other certain embodiments no greater than 2 ton ($2.7 \times 10^2$ Pa). Typically, the deposition chamber is purged with an inert carrier gas after the vaporized precursor composition(s) have been introduced into the chamber and/or reacted for each cycle. The inert carrier gas/gases can also be introduced with the vaporized precursor composition(s) during each cycle.

The reactivity of a precursor composition can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

After layer formation on the substrate, an annealing process may be optionally performed in situ in the deposition chamber in a reducing, inert, plasma, or oxidizing atmosphere. Typically the annealing temperature can be at least 400° C., in some embodiments at least 500° C., and in some other embodiments at least 600° C. The annealing temperature is typically no greater than 1000° C., in some embodiments no greater than 750° C., and in some other embodiments no greater than 700° C.

The annealing operation is typically performed for a time period of at least 0.5 minute, and in certain embodiments for a time period of at least 1 minute. Additionally, the annealing operation is typically performed for a time period of no greater than 60 minutes, and in certain embodiments for a time period of no greater than 10 minutes.

One skilled in the art will recognize that such temperatures and time periods may vary. For example, furnace anneals and rapid thermal annealing may be used, and further, such anneals may be performed in one or more annealing steps.

As stated above, the use of the compounds and methods of forming films of the present disclosure are beneficial for a wide variety of thin film applications in semiconductor structures, particularly those using high dielectric permittivity materials. For example, such applications include gate dielectrics and capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

Figure 2:
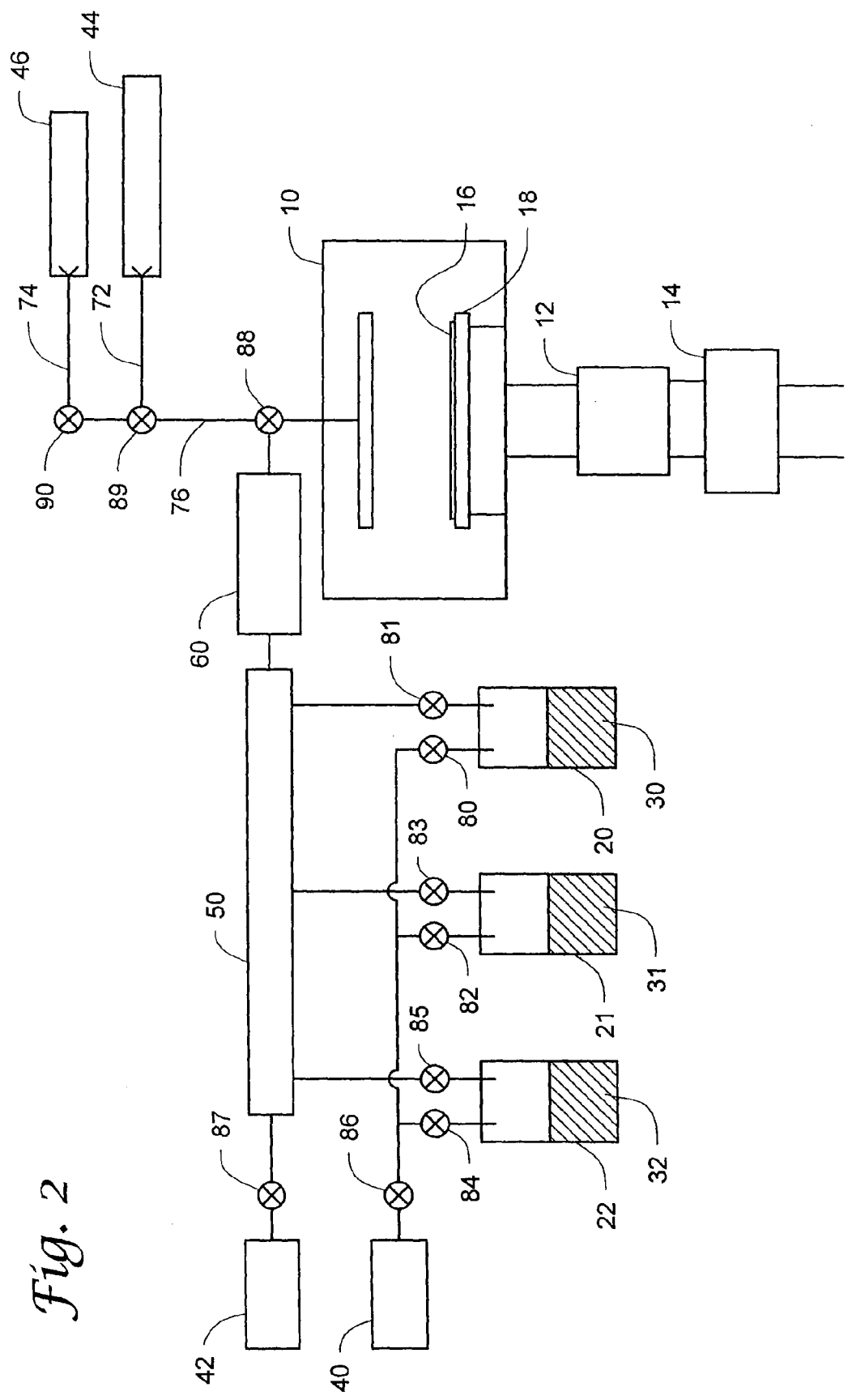
FIG. 2 is a perspective view of a vapor deposition system suitable for use in methods as described herein.

An example system that can be used to perform an atomic layer deposition method as described herein is shown in FIG. 2. For simplicity, the system illustrated in FIG. 2 is representative of a single wafer tool having a single wafer chamber. However, it should be understood that the methods disclosed herein can be applicable to other systems including, but not limited to, small batch systems and full-furnace deposition systems. The system illustrated in FIG. 2 includes an enclosed vapor deposition chamber 10, in which a vacuum may be created using turbo pump 12 and backing pump 14. One or more substrates 16 (e.g., semiconductor substrates or substrate assemblies) can be positioned in chamber 10. A constant nominal temperature can be established for substrate 16, which can vary depending on the process used. Substrate 16 may be heated, for example, by an electrical resistance heater 18 on which substrate 16 can be mounted. Other known methods of heating the substrate may also be utilized.

In this process, titanium precursor composition(s) 30 and strontium precursor composition(s) 31 can be stored in vessels 20 and 21, respectively. Vessel 22 can be used to store optional solvent 32. The precursor composition(s) 30 and 31 and optional solvent 32 can be maintained under an inert atmosphere supplied by inert gas 40 by actuating valves 80, 82, 84, and 86 as desired. Optional inert carrier gas 42 (which can be the same as or different than inert gas 40), titanium precursor composition(s) 30, strontium precursor composition(s) 31, and/or optional solvent 32 can independently be delivered to optional manifold 50, optional vaporizer 60, and deposition chamber 10 by actuating valves 81, 83, 85, 87, and 88 as desired. A reaction gas 44 can be supplied along line 72 as desired by actuating valve 89. Optional gas 46 (e.g., a purge gas, which can be the same as or different than inert gas 40 and/or inert carrier gas 42) can be supplied along line 74 as desired by actuating valve 90.

Figure 3:
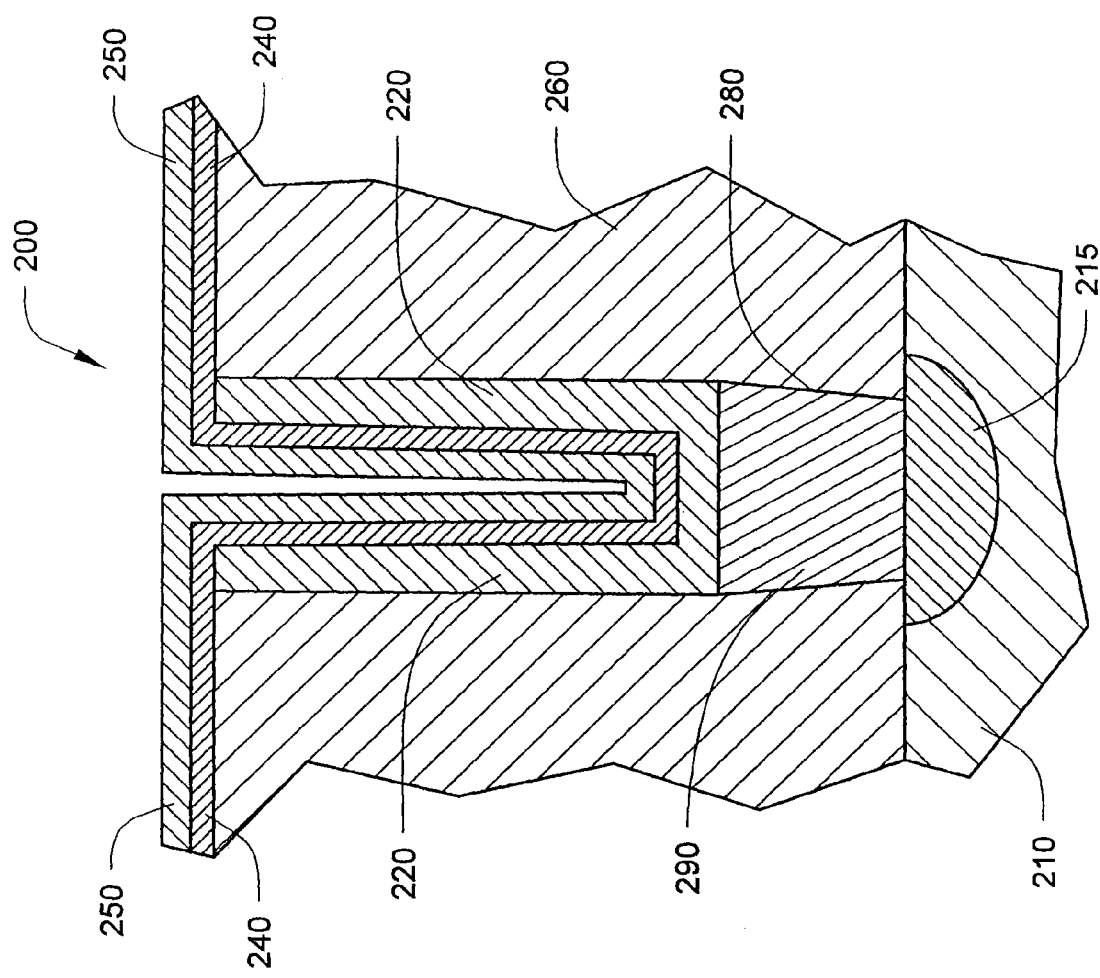
FIG. 3 is an example capacitor construction formed using methods as described herein.

FIG. 3 shows an example of the ALD formation of metal-containing layers of the present disclosure as used in an example capacitor construction. Referring to FIG. 3, capacitor construction 200 includes substrate 210 having conductive diffusion area 215 formed therein. Substrate 210 can include, for example, silicon. An insulating layer 260, such as BPSG, is provided over substrate 210, with contact opening 280 provided therein to diffusion area 215. Conductive material 290 fills contact opening 280, and may include, for example, tungsten or conductively doped polysilicon. Capacitor construction 200 includes a first capacitor electrode (a bottom electrode) 220, a dielectric layer 240 which may be formed by methods as described herein, and a second capacitor electrode (a top electrode) 250.

It is to be understood that FIG. 3 is an example construction, and methods as described herein can be useful for forming layers on any substrate, for example on semiconductor structures, and that such applications include capacitors such as planar cells, trench cells, (e.g., double sidewall trench capacitors), stacked cells (e.g., crown, V-cell, delta cell, multi-fingered, or cylindrical container stacked capacitors), as well as field effect transistor devices.

Furthermore, a diffusion barrier layer may optionally be formed over the dielectric layer 240, and may, for example, include TiN, TaN, metal silicide, or metal silicide-nitride. While the diffusion barrier layer is described as a distinct layer, it is to be understood that the barrier layers may include conductive materials and can accordingly, in such embodiments, be understood to include at least a portion of the capacitor electrodes. In certain embodiments that include a diffusion barrier layer, an entirety of a capacitor electrode can include conductive barrier layer materials.

The following example is offered to further illustrate various specific embodiments and techniques of the present disclosure. It should be understood, however, that many variations and modifications understood by those of ordinary skill in the art may be made while remaining within the scope of the present disclosure. Therefore, the scope of the present disclosure is not intended to be limited by the following example.

EXAMPLES

Example 1

A strontium titanate layer was deposited on a platinum substrate by ALD using $Sr(thd)_2$ as a metal-organic strontium precursor compound, $Ti(mpd)(thd)_2$ as a titanium precursor compound, and ozone as a reaction gas. The titanium precursor flow rate was 0.8 milliliters (ml) per minute; the strontium precursor flow rate was 0.8 ml per minute; and the ozone flow rate was 3 standard liters per minute (slm) using 15% by volume ozone. The lines were flushed with tetrahydrofuran at a flow rate of from 0.4 to 1 ml per minute for 15 to 30 seconds after each titanium oxide and strontium oxide deposition cycle. The deposition was carried out using a vaporizer temperature of 290° C., a process pressure of from 1 to 2 Torr (from $1.3 \times 10^2$ to $2.6 \times 10^2$ Pa), and a substrate temperature of from 300° C. to 350° C. Pumping was conducted using a turbo pump to pump down to a base of 20 mTorr (2.7 Pa).

Each titanium oxide deposition cycle consisted of a 60 second titanium precursor dose, a 30 second purge, a 30 second oxidizer dose, and a 20 second purge. Each strontium oxide deposition cycle consisted of a 30 second strontium precursor dose, a 30 second purge, a 30 second ozone dose, and a 30 second purge.

The strontium titanate layer was deposited using 11 titanium oxide deposition cycles for the initial titanium oxide deposition phase. The intermediate deposition phase consisted of 3 strontium oxide deposition cycles, followed by 20 sets of, in order, 11 titanium oxide deposition cycles and 3 strontium oxide deposition cycles. Finally, 11 titanium oxide deposition cycles were used for the final titanium oxide deposition phase.

Figure 4:
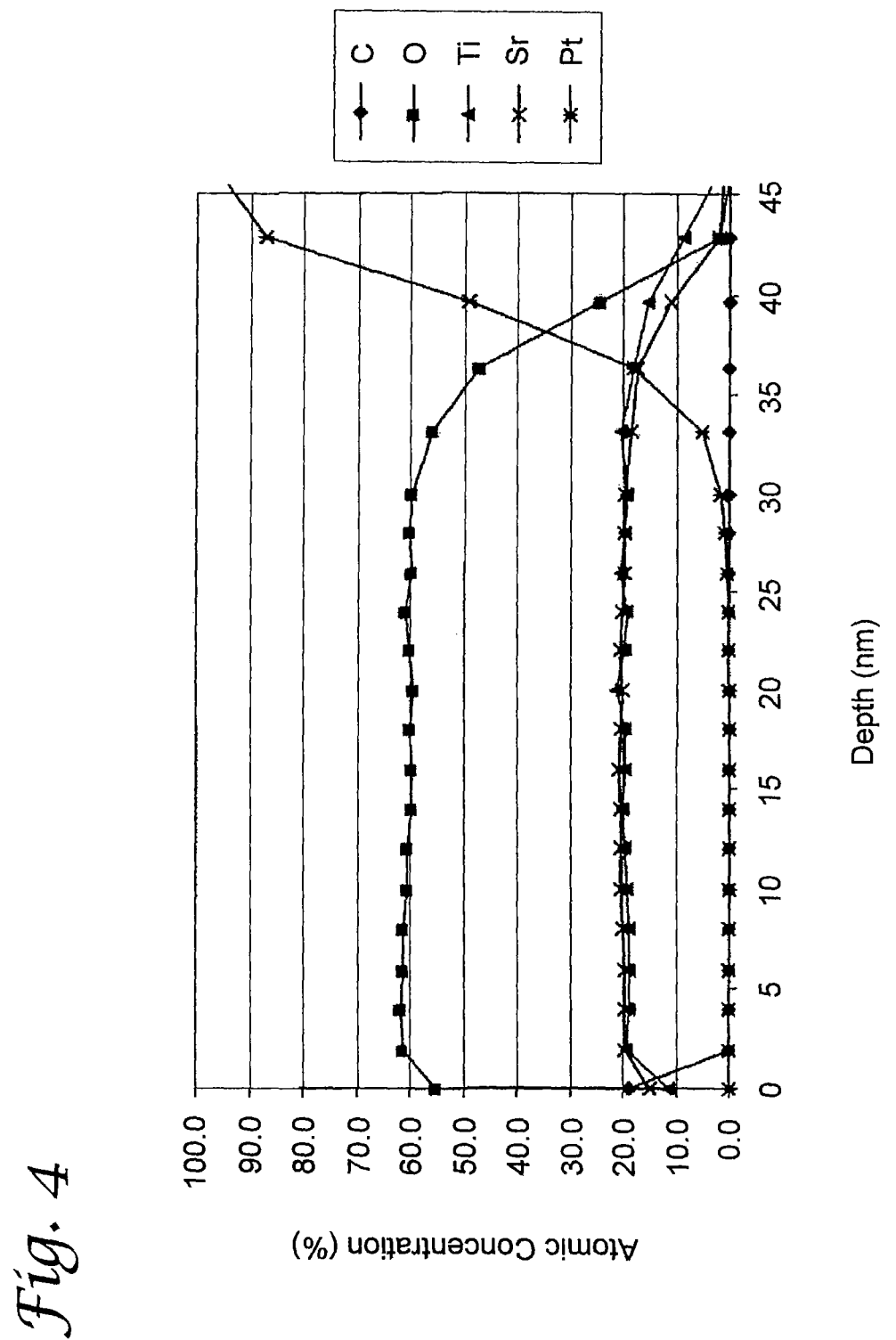
FIG. 4 depicts an x-ray photoelectron spectrum (XPS) for an embodiment of a strontium titanate layer prepared by a method as described in Example 1. The spectrum is a plot of depth (nanometers; x-axis) versus atomic concentration (atomic percent; y-axis).

After deposition was complete, the deposited layer was rapid thermal process (RTP) annealed for 5 minutes at 600° C., resulting in an approximately 35 to 40 nanometers thick strontium titanate layer. An X-ray photoelectron spectrum (XPS) of the layer (measured at center) was run, and a plot of atomic concentration (atomic percent; y-axis) versus depth (nanometers; x-axis) is illustrated in FIG. 4. The plot indicates that the atomic concentrations of titanium and strontium are substantially the same throughout the bulk of the layer (e.g., from approximately 2 nanometers to approximately 33 nanometers).

Figure 5A:
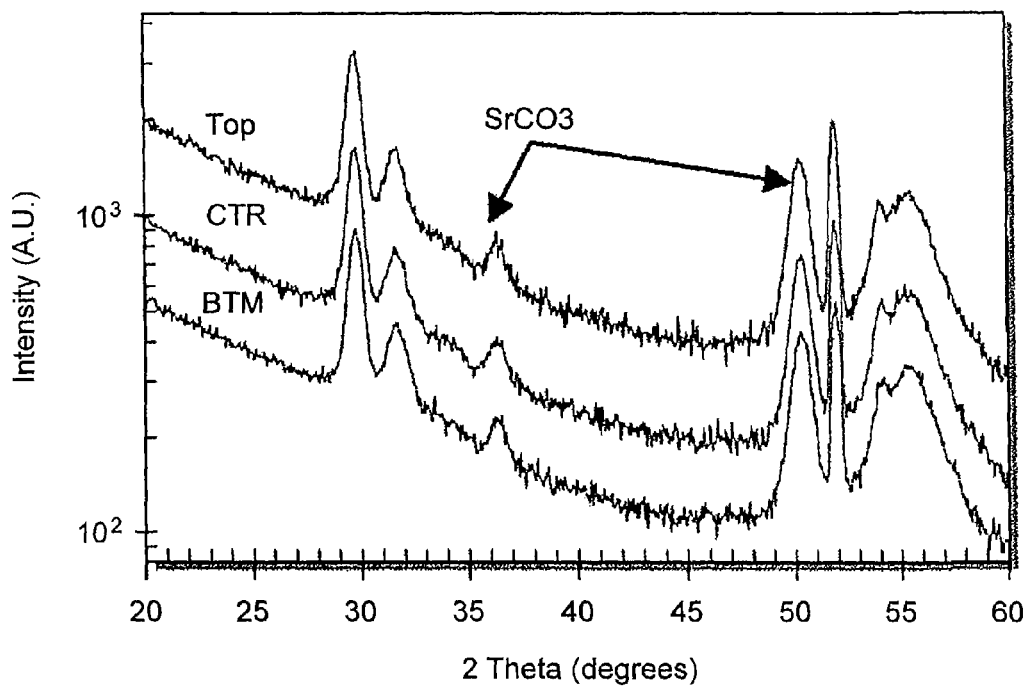
FIGS. 5a and 5b are plots of 2 theta (degrees; x-axis) versus intensity (arbitrary units or A.U.; y-axis).
Figure 5B:
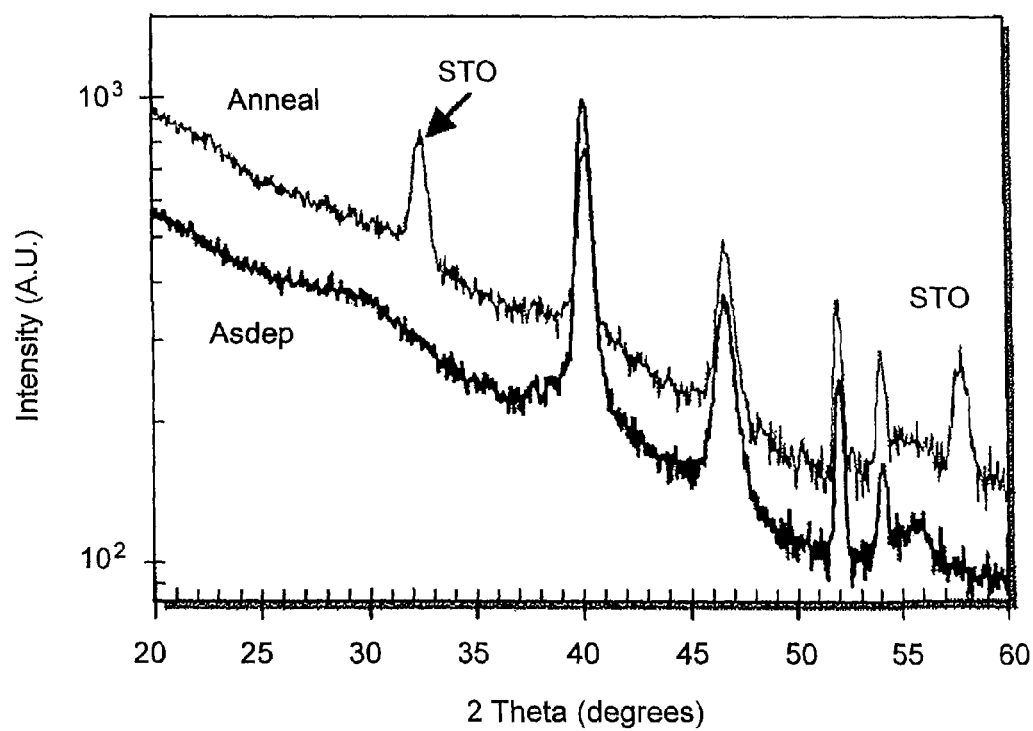

X-ray diffraction (XRD) data was also gathered for strontium titanate prepared as described in Example 1, and the data was compared to that for strontium titanate prepared in a similar manner, but without the initial and final titanium oxide deposition phases (i.e., Comparative Example 1). A strontium carbonate peak ($SrCO_3$) is indicated in the data presented in FIG. 5a, which is a plot of intensity (arbitrary units or A.U.; y-axis) versus 2 theta (degrees; x-axis) measured for material at the top, center (ctr), and bottom (btm) of the furnace, for Comparative Example 1. In contrast, a peak for strontium carbonate was not indicated in the data presented in FIG. 5b, which is a plot of intensity (arbitrary units or A.U.; y-axis) versus 2 theta (degrees; x-axis) measured as deposited and after annealing for the strontium titanate prepared as described in Example 1. Peaks for the desired strontium titanate (STO) are indicated after annealing.

Figure 6A:
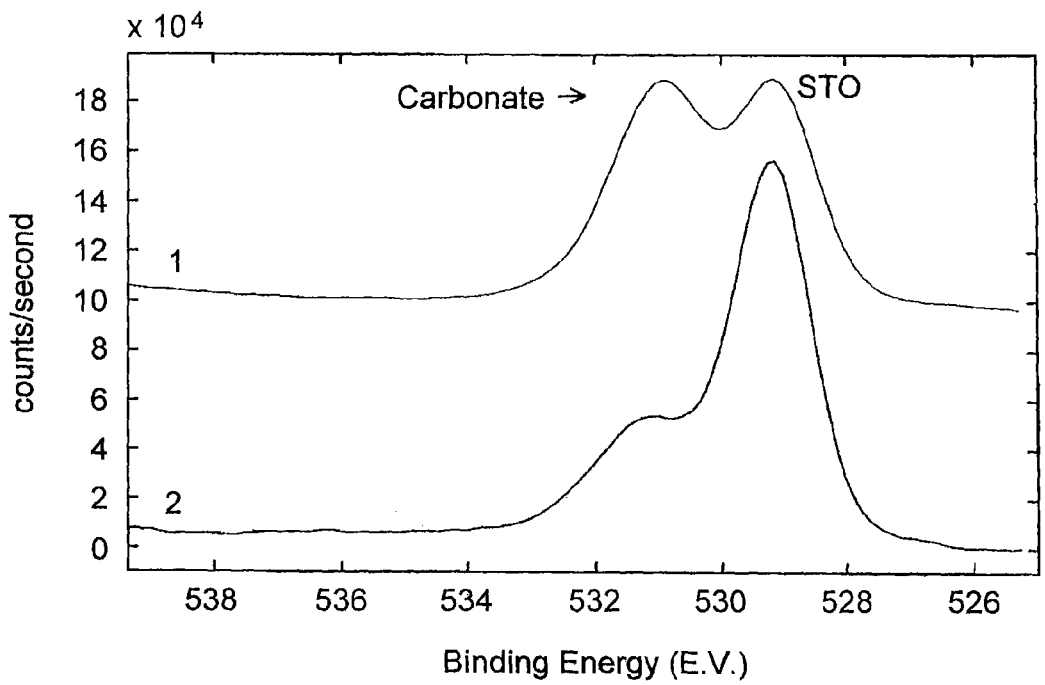
FIGS. 6a and 6b are plots of Binding Energy (electron volts or E.V.; x-axis) versus counts per second (y-axis).
Figure 6B:
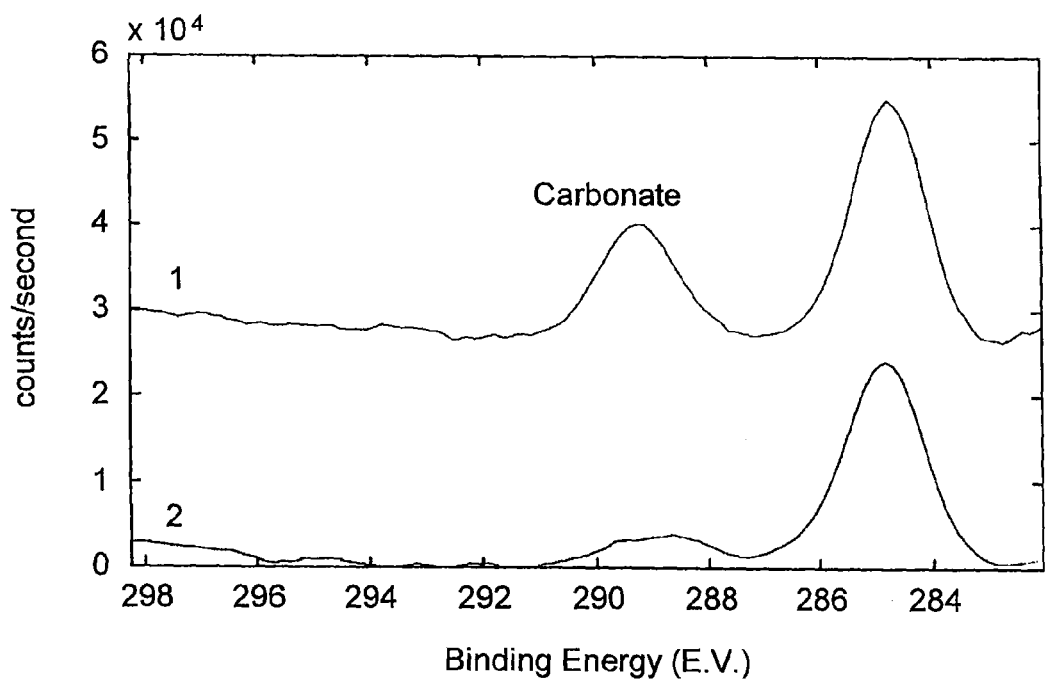

Angle resolved x-ray photoelectron spectra for Comparative Example 1 (labeled "1") and strontium titanate prepared as described in Example 1 (labeled "2") are illustrated in FIG. 6, which are scans (counts per second; y-axis) of binding energy (electron volts or E.V.; x-axis) over the spectral range of interest. FIG. 6a is an illustration of an oxygen multiplex graph, and shows a peak for strontium titanate (labeled "STO") in both scan 1 (Comparative Example 1) and scan 2 (Example 1). The peak for carbonate and adventitious surface carbon (labeled "carbonate") is substantially smaller for scan 2 (Example 1) than for scan 1 (Comparative Example 1). FIG. 6b is an illustration of a carbon multiplex graph. Again, the peak for carbonate and adventitious surface carbon (labeled "carbonate") is substantially smaller for scan 2 (Example 1) than for scan 1 (Comparative Example 1).

CONCLUSION

Some embodiments of the methods described herein can form a metal-containing layer on a substrate (e.g., a semiconductor substrate or substrate assembly). The method can include: providing a vapor including at least one titanium precursor compound; providing a vapor including at least one metal-organic strontium precursor compound; optionally providing a reaction gas (e.g., an oxidizing gas); and contacting the vapor including the at least one titanium precursor compound, the vapor including the at least one strontium precursor compound, and optionally the reaction gas with a substrate to form a metal-containing layer on at least one surface of the substrate using an atomic layer deposition process including a plurality of deposition cycles. In certain embodiments, the plurality of deposition cycles includes an initial titanium oxide deposition phase including at least one titanium oxide deposition cycle. In other certain embodiments, the plurality of deposition cycles includes a final titanium oxide deposition phase including at least one titanium oxide deposition cycle. In still other certain embodiments, the plurality of deposition cycles includes both an initial titanium oxide deposition phase and a final titanium oxide deposition phase, both phases including at least one titanium oxide deposition cycle. In certain embodiments, the plurality of deposition cycles further includes an intermediate deposition phase that includes a plurality of strontium oxide deposition cycles and a plurality of titanium oxide deposition cycles. Optionally, the method can further include annealing the metal-containing layer to form, for example, a strontium titanate layer (e.g., a dielectric layer). In certain embodiments, the strontium titanate layer can have low carbon content (e.g., a low strontium carbonate content).

Some other embodiments of methods as described herein can be used to manufacture a semiconductor structure. The method can include: providing a vapor including at least one titanium precursor compound; providing a vapor including at least one metal-organic strontium precursor compound; directing the vapor including the at least one titanium precursor compound to an atomic layer deposition chamber containing a semiconductor substrate or substrate assembly and allowing the at least one titanium precursor compound to chemisorb to at least one surface of the semiconductor substrate assembly; and directing the vapor including the at least one strontium precursor compound to the atomic layer deposition chamber and allowing the at least one strontium precursor compound to chemisorb to at least one surface of the semiconductor substrate assembly to form a metal-containing layer on at least one surface of the semiconductor substrate or substrate assembly using an atomic layer deposition process including a plurality of deposition cycles. As further described herein, the plurality of deposition cycles can include an initial titanium oxide deposition phase including at least one titanium oxide deposition cycle and/or a final titanium oxide deposition phase including at least one titanium oxide deposition cycle.

Certain other embodiments of methods as described herein can be used to manufacture a memory device. The method can include: providing a vapor including at least one titanium precursor compound; providing a vapor including at least one metal-organic strontium precursor compound; optionally providing at least one reaction gas; and contacting the vapor including the at least one titanium precursor compound and the vapor including the at least one strontium precursor compound with a substrate having a first electrode thereon to form a dielectric layer on at least a portion of the first electrode of the substrate using an atomic layer deposition process including a plurality of deposition cycles. As further described herein, the plurality of deposition cycles can include an initial titanium oxide deposition phase including at least one titanium oxide deposition cycle, and/or a final titanium oxide deposition phase including at least one titanium oxide deposition cycle. The method can further include forming a second electrode on the dielectric layer.

The complete disclosures of the patents, patent documents, and publications cited herein are incorporated by reference in their entirety as if each were individually incorporated. Various modifications and alterations to the embodiments described herein will become apparent to those skilled in the art without departing from the scope and spirit of the present disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows. As used herein, the term "comprising," which is synonymous with "including" or "containing," is inclusive, open-ended, and does not exclude additional unrecited elements or method steps.

What is claimed is:

1. A method of forming a metal-containing layer on a substrate, the method comprising:
   providing a vapor comprising at least one titanium precursor compound;
   providing a vapor comprising at least one metal-organic strontium precursor compound; and
   contacting the vapor comprising the at least one titanium precursor compound and the vapor comprising the at least one strontium precursor compound with a substrate to form a $SrTiO_3$-containing material on at least one surface of the substrate using an atomic layer deposition process comprising multiple atomic layer deposition cycles, wherein the multiple deposition cycles comprises a plurality of strontium oxide atomic layer deposition cycles and a plurality of titanium oxide atomic layer deposition cycles, the plurality of titanium oxide atomic layer deposition cycles being greater in number than the plurality of strontium oxide atomic layer deposition cycles and resulting in the $SrTiO_3$-containing material having a strontium:titanium atomic ratio of from 0.9:1.0 to 1.0:0.9, the multiple deposition cycles comprising multiple sets of consecutive strontium oxide atomic layer deposition cycles alternating with consecutive titanium oxide atomic layer deposition cycles.

2. The method of claim 1 wherein the multiple deposition cycles begins and ends with one or more strontium oxide atomic layer deposition cycles.

3. The method of claim 1 wherein the multiple sets are at least 4 in number.

4. The method of claim 3 wherein the multiple sets are from 4 to 20 in number.

5. The method of claim 3 wherein the consecutive strontium oxide atomic layer deposition cycles within individual of the sets is from 2 to 4 in number, and the consecutive titanium oxide atomic layer deposition cycles within individual of the sets is from 7 to 14 in number.

6. A method of forming a capacitor, comprising:
   forming a first capacitor electrode;
   forming a capacitor dielectric over the first capacitor electrode, the forming of the capacitor dielectric comprising:
      providing a vapor comprising at least one titanium precursor compound;
      providing a vapor comprising at least one metal-organic strontium precursor compound; and
      contacting the vapor comprising the at least one titanium precursor compound and the vapor comprising the at least one strontium precursor compound with a substrate to form $SrTiO_3$-containing material on at least one surface of the substrate using an atomic layer deposition process comprising multiple atomic layer deposition cycles, wherein the multiple deposition cycles sequentially comprise:
         an initial titanium oxide deposition phase comprising an initial plurality of titanium oxide atomic layer deposition cycles;
         an intermediate deposition phase comprising an intermediate plurality of strontium oxide atomic layer deposition cycles and an intermediate plurality of titanium oxide atomic layer deposition cycles, the intermediate plurality of titanium oxide atomic layer deposition cycles being greater in number than the intermediate plurality of strontium oxide atomic layer deposition cycles and resulting in the intermediate deposition phase to comprise $SrTiO_3$ having a strontium:titanium atomic ratio of from 0.9:1.0 to 1.0:0.9; and
         a final titanium oxide deposition phase comprising a final plurality of titanium oxide atomic layer deposition cycles; and
   forming a second capacitor electrode over the capacitor dielectric.

7. The method of claim 6 wherein the $SrTiO_3$-containing material has a strontium carbonate content of at most 5 atomic percent, based on metal atoms.

8. The method of claim 6 wherein the intermediate deposition phase comprises multiple sets of consecutive strontium oxide atomic layer deposition cycles alternating with consecutive titanium oxide atomic layer deposition cycles.

9. The method of claim 8 wherein the intermediate deposition phase begins and ends with one or more strontium oxide atomic layer deposition cycles.

10. The method of claim 8 wherein the consecutive strontium oxide atomic layer deposition cycles within individual of the sets is from 2 to 4 in number, and the consecutive titanium oxide atomic layer deposition cycles within individual of the sets is from 7 to 14 in number.

11. A method of forming a capacitor, comprising:
forming a first capacitor electrode;
forming a capacitor dielectric over the first capacitor electrode, the forming of the capacitor dielectric comprising:
providing a vapor comprising at least one titanium precursor compound;
providing a vapor comprising at least one metal-organic strontium precursor compound;
providing at least one oxidizing reaction gas; and
contacting the vapor comprising the at least one titanium precursor compound, the vapor comprising the at least one strontium precursor compound, and the at least one oxidizing reaction gas with the substrate to form $SrTiO_3$-containing material on at least one surface of a substrate using an atomic layer deposition process comprising multiple atomic layer deposition cycles, wherein the multiple deposition cycles sequentially comprise:
an initial titanium oxide deposition phase comprising an initial plurality of titanium oxide atomic layer deposition cycles;
an intermediate deposition phase comprising an intermediate plurality of strontium oxide atomic layer deposition cycles and an intermediate plurality of titanium oxide atomic layer deposition cycles, the intermediate plurality of titanium oxide atomic layer deposition cycles being greater in number than the intermediate plurality of strontium oxide atomic layer deposition cycles and resulting in the intermediate deposition phase to comprise $SrTiO_3$ having a strontium:titanium atomic ratio of from 0.9:1.0 to 1.0:0.9; and
a final titanium oxide deposition phase comprising a final plurality of titanium oxide atomic layer deposition cycles; and
forming a second capacitor electrode over the capacitor dielectric.

12. The method of claim 11 wherein the $SrTiO_3$-containing material has a strontium carbonate content of at most 5 atomic percent, based on metal atoms.

13. The method of claim 11 wherein the intermediate deposition phase comprises multiple sets of consecutive strontium oxide atomic layer deposition cycles alternating with consecutive titanium oxide atomic layer deposition cycles.

14. The method of claim 13 wherein the intermediate deposition phase begins and ends with one or more strontium oxide atomic layer deposition cycles.

15. The method of claim 13 wherein the consecutive strontium oxide atomic layer deposition cycles within individual of the sets is from 2 to 4 in number, and the consecutive titanium oxide atomic layer deposition cycles within individual of the sets is from 7 to 14 in number.

16. A method of forming a capacitor, comprising:
forming a first capacitor electrode;
forming a capacitor dielectric over the first capacitor electrode, the forming of the capacitor dielectric comprising:
providing a vapor comprising at least one titanium precursor compound;
providing a vapor comprising at least one metal-organic strontium precursor compound;
providing at least one reaction gas; and
contacting the vapor comprising the at least one titanium precursor compound and the vapor comprising the at least one strontium precursor compound with a substrate to form $SrTiO_3$-containing material on at least one surface of the substrate using an atomic layer deposition process comprising multiple atomic layer deposition cycles, wherein the multiple deposition cycles sequentially comprise:
an initial titanium oxide deposition phase comprising at least one titanium oxide deposition cycle; and
a subsequent deposition phase comprising a plurality of strontium oxide atomic layer deposition cycles and a plurality of titanium oxide atomic layer deposition cycles, the plurality of titanium oxide atomic layer deposition cycles in the subsequent deposition phase being greater in number than the plurality of strontium oxide atomic layer deposition cycles in the subsequent deposition phase and resulting in the subsequent deposition phase to comprise $SrTiO_3$ having a strontium:titanium atomic ratio of from 0.9:1.0 to 1.0:0.9, the subsequent deposition phase comprising multiple sets of consecutive strontium oxide atomic layer deposition cycles alternating with consecutive titanium oxide atomic layer deposition cycles; and
forming a second capacitor electrode over the capacitor dielectric.

17. The method of claim 16 wherein the $SrTiO_3$-containing material has a strontium carbonate content of at most 5 atomic percent, based on metal atoms.

18. The method of claim 16 wherein the intermediate deposition phase begins and ends with one or more strontium oxide atomic layer deposition cycles.

19. The method of claim 16 wherein the consecutive strontium oxide atomic layer deposition cycles within individual of the sets is from 2 to 4 in number, and the consecutive titanium oxide atomic layer deposition cycles within individual of the sets is from 7 to 14 in number.

20. The method of claim 1 wherein individual of the plurality of titanium oxide atomic layer deposition cycles include exposure to an oxidizing reaction gas in addition to the vapor comprising at least one titanium precursor compound.

21. The method of claim 6 wherein individual of the intermediate plurality of titanium oxide atomic layer deposition cycles include exposure to an oxidizing reaction gas in addition to the vapor comprising at least one titanium precursor compound.

22. The method of claim 16 wherein individual of the plurality of titanium oxide atomic layer deposition cycles in the subsequent deposition phase include exposure to an oxidizing reaction gas in addition to the vapor comprising at least one titanium precursor compound.

23. A method of forming a capacitor, comprising:
forming a first capacitor electrode;
forming a capacitor dielectric over the first capacitor electrode, the forming of the capacitor dielectric comprising:
providing a vapor comprising at least one titanium precursor compound;
providing a vapor comprising at least one metal-organic strontium precursor compound; and
contacting the vapor comprising the at least one titanium precursor compound and the vapor comprising the at least one strontium precursor compound with a substrate to form a $SrTiO_3$-containing material on at least one surface of the substrate using an atomic layer deposition process comprising multiple atomic layer deposition cycles, wherein the multiple deposition cycles comprises a plurality of strontium oxide atomic layer deposition cycles and a plurality of titanium oxide atomic layer deposition cycles, the plurality of titanium oxide atomic layer deposition cycles being greater in number than the plurality of strontium oxide atomic layer deposition cycles and resulting in the $SrTiO_3$-containing material having a strontium:titanium atomic ratio of from 0.9:1.0 to 1.0:0.9, the multiple deposition cycles comprising multiple sets of consecutive strontium oxide atomic layer deposition cycles alternating with consecutive titanium oxide atomic layer deposition cycles; and forming a second capacitor electrode over the capacitor dielectric.

24. The method of claim 23 wherein individual of the plurality of titanium oxide atomic layer deposition cycles include exposure to an oxidizing reaction gas in addition to the vapor comprising at least one titanium precursor compound.

* * * * *